United States Patent [19]
Tirrell

[11] Patent Number: 5,665,937
[45] Date of Patent: Sep. 9, 1997

[54] SCSI STRAIN RELIEF BULKHEAD WITH EMI SHIELDING

[75] Inventor: Paul T. Tirrell, Uxbridge, Mass.

[73] Assignee: EMC Corporation, Hopkinton, Mass.

[21] Appl. No.: 580,740

[22] Filed: Dec. 29, 1995

[51] Int. Cl.$^6$ ................................................. H05K 9/00
[52] U.S. Cl. ...................... 174/35 R; 361/818; 174/65 R
[58] Field of Search ............................. 174/35 R, 51, 174/52.1, 65 R; 361/816, 818, 753, 752, 796, 799, 800; 248/74.1, 65

[56] References Cited

U.S. PATENT DOCUMENTS

| | | | |
|---|---|---|---|
| 1,880,352 | 10/1932 | McMurtrie | 285/19 |
| 2,288,844 | 7/1942 | Schilling | 248/66 |
| 2,288,845 | 7/1942 | Schilling | 248/66 |
| 4,385,504 | 5/1983 | Perrone et al. | 62/259.1 |

Primary Examiner—Kristine L. Kincaid
Assistant Examiner—Kristina Soderquist
Attorney, Agent, or Firm—Maureen Stretch

[57] ABSTRACT

A strain relief bulkhead that provides EMI shielding for data cables being inserted into cabinets, including a conductive vise, slidably mounted on a stationary guide track that is permanently attached to a bracket made of conductive material to which a conductive cover panel is removably fastened. In a preferred embodiment the vise is moved along the guide track by a threaded screw which extends through threaded openings in the guide track. A C-ring holds the end of the screw to the vise. The bracket containing the vise and guide track is fastened to the cabinet which houses the printed circuit boards by screws or other means. The vise is located on the guide track and the guide track is attached to the bracket in such a way as to provide cable openings through which cables can be inserted. As cables are inserted they are held in place, after fastening the cover panel to the bracket, by sliding the vise to hold the cables against the walls of the bracket, the vise, and the cover panel, thus grounding the cables for EMI shielding and providing strain relief.

11 Claims, 8 Drawing Sheets

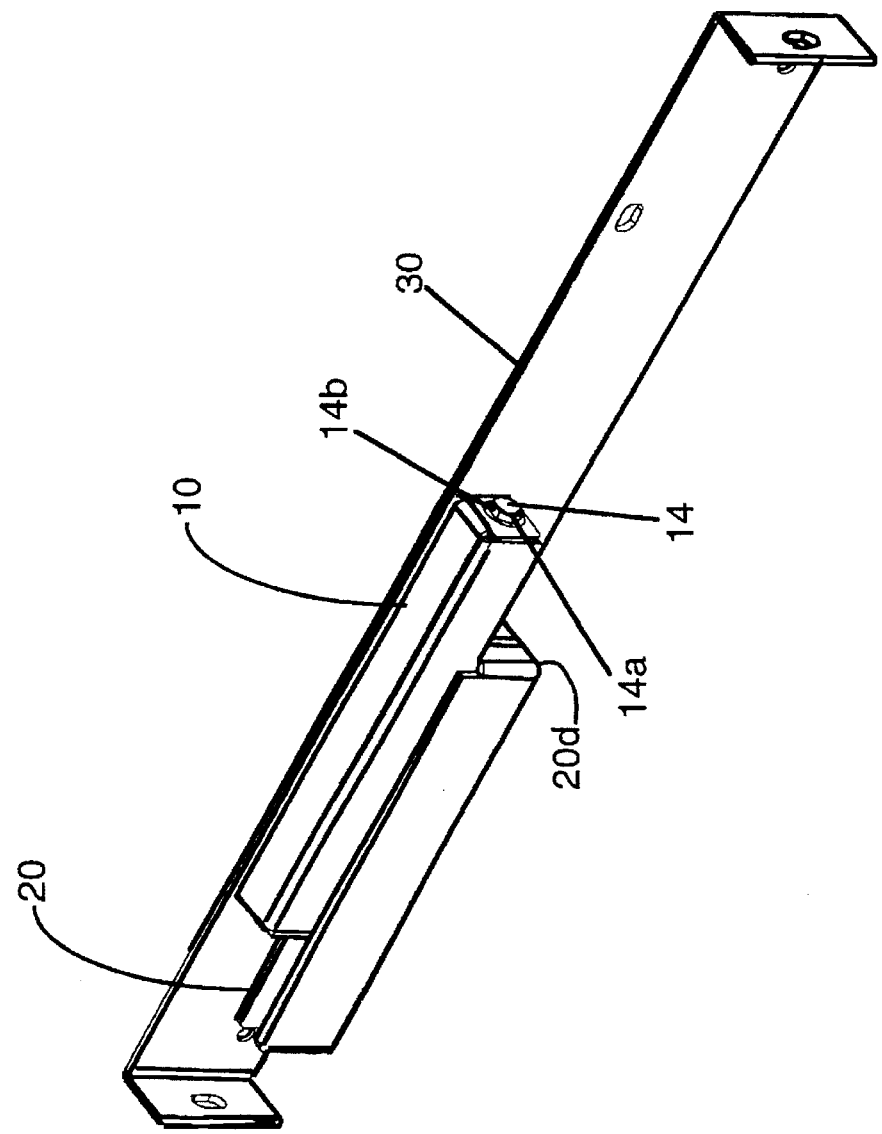

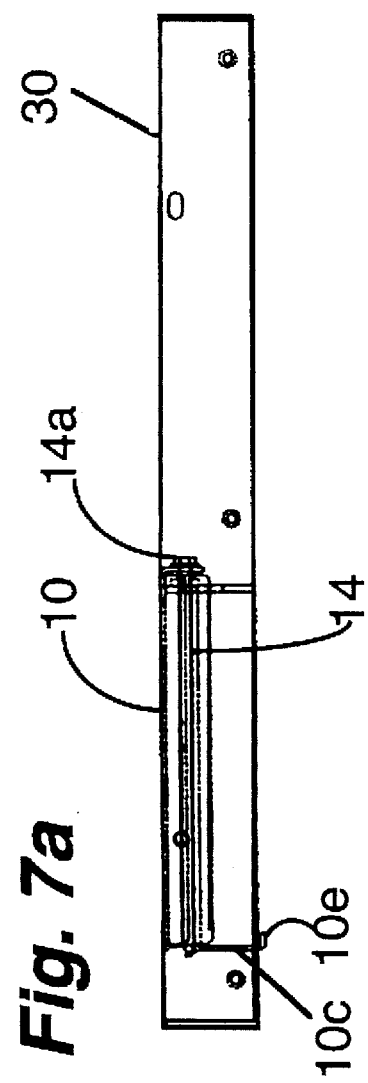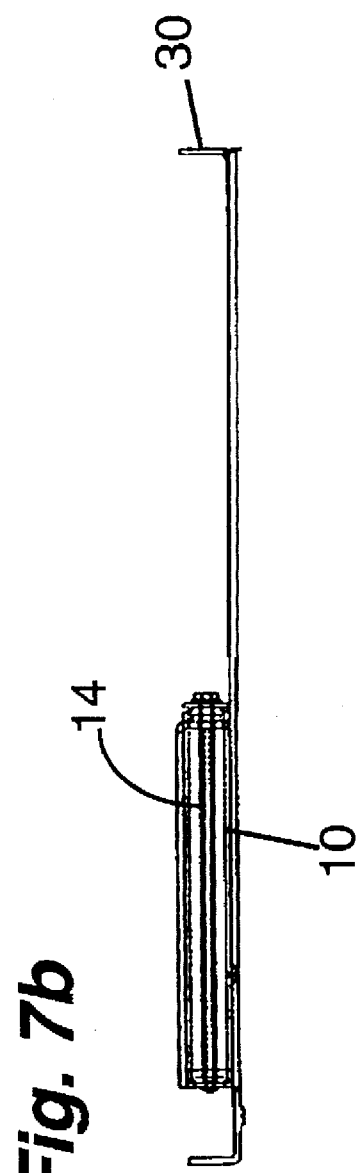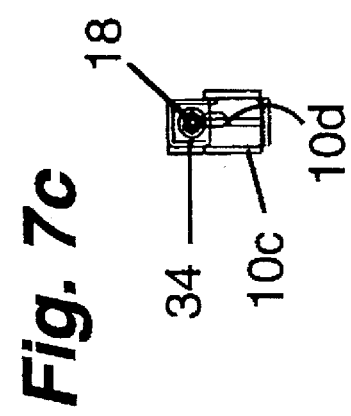
Fig. 7a
Fig. 7b
Fig. 7c

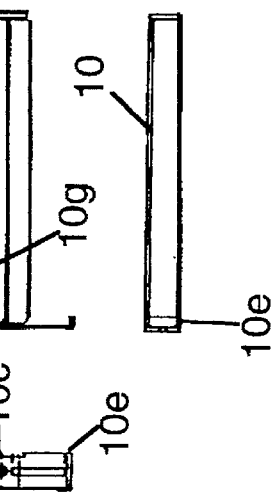
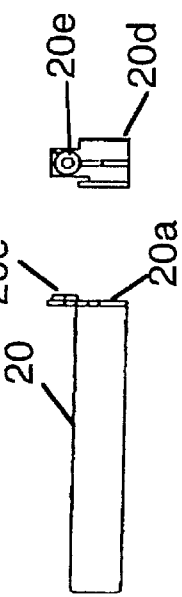
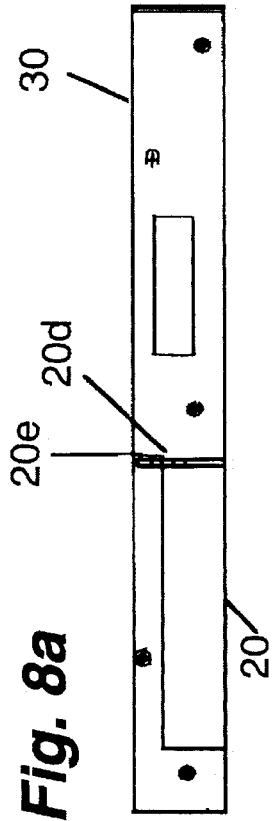
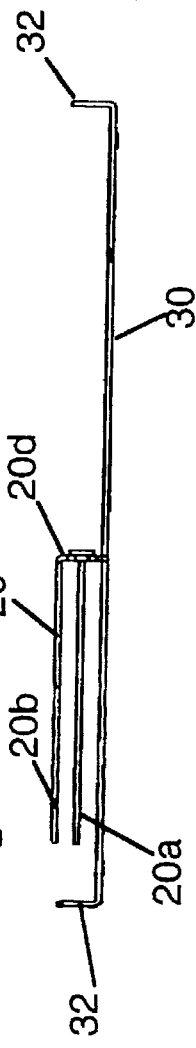
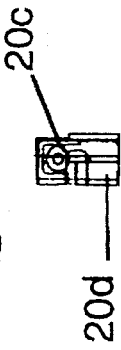

SCSI STRAIN RELIEF BULKHEAD WITH EMI SHIELDING

BACKGROUND OF THE INVENTION

The invention relates generally to the field of strain relief for cables and EMI shielding and more specifically to a bulkhead for use with SCSI and similar data cables that provides strain relief for the cables as well as EMI shielding.

Manufacturers of devices that use multiple SCSI (Small Computer Systems Interface) or similar data cables to connect to printed circuit boards mounted in computers or controllers face the problem of connecting the cables to a system that must also meet United States Federal Communications Commissions (FCC) ElectroMagnetic Interference shielding requirements. Such systems are often enclosed in cabinets that serve as EMI shields. If an opening is made in the cabinet to permit SCSI or similar cables to enter, this opening can allow the cable to become an "antenna" that leaks EMI emissions. Such leaks may cause interference with radio or television reception nearby, hence the regulations for EMI shielding.

In addition to EMI emission leakage, a second problem facing device manufacturers is that of strain relief for data cables. If several cables are simply attached to their respective expensive printed circuit boards through a sufficiently large hole in the cabinet, an accidental pull or stress on one or more of the cables might cause the cable(s) to damage the expensive printed circuit boards. When several devices are attached to boards in one cabinet, it is easy for a service technician to pull the wrong cable out, and—if too much force is used—rip the connector off the board, causing damage to the board. Since the printed circuit boards may cost thousands or tens of thousands of dollars, while the cables and cabinets are relatively inexpensive, it is desirable to minimize the possibility of any such damage.

One approach to solving the EMI shielding problem is to enclose the system within an EMI shield housing and then surround that housing with another outer cabinet or "skin." Typically, data cables then connect to connectors built into the EMI shield housing and through apertures in the outer housing. This is usually a much more expensive approach. It is harder to cool such a system. Such a design also tends to impose inherent limits on the number of SCSI or data cables that can be connected to the boards in the housing, and ultimately, to the number of boards in a particular cabinet. To the extent that multiple connectors are needed to connect one cable to one board in this type of design, signal strength can also be attenuated.

Another approach to solving the problem uses a cable EMI block made of two opposing metal plates with hemispherical channels formed on the inner surface of each plate so that one or more cables can be placed in the channels and held firmly in contact with the plates. The plates then function as grounding devices and also provide strain relief when they are clamped together.

A disadvantage of this approach is that it takes approximately forty-five minutes to an hour for a service technician to add or remove a full set of cables grounded by means of such an EMI block in a typical cabinet. Several screws holding it together need to be unscrewed. For reassembly, the cables must be placed within the channels and the plates fastened together again. It is awkward to hold the plates and cables in place while reassembling. It may require new or additional tools for assembly. Since it is also a bulky device, when it is installed in a cabinet it tends to make it difficult for the technician to reach inside the cabinet and to work with bulkheaded connectors located below and beneath it in the cabinet. Thus it is much simpler to remove the block for those processes, even though that may increase the risk of damage to the boards. Since the block has to be unclamped to remove or add a cable, all the cables may be left to hang freely for nearly an hour while the service technician inserts or removes cable. An accidental strain or pull that applies too much force to one of the dangling cables can cause damage to the board to which the cable is connected.

A third disadvantage of this approach is that the hemispherical channels of the block, although designed to fit tightly with the grounding shield mesh on the exterior of a typical SCSI cable, to provide strain relief as well as shielding may not, in fact, always meet the goal of strain relief. Some of the channels may not be machined to the specified tolerance and the cable may be too loose in the block—even after the block is clamped shut—to provide good strain relief. If the openings in the plates are too loose to establish good strain relief, this approach also does not allow for any adjustment to occur.

Another disadvantage of this and other approaches is that they may require special tools to be used for their installation and removal, thus increasing the costs of a solution.

It is an object of the present invention to provide a strain relief and EMI shielding device for bulkheaded SCSI or other data cables that is both easy to use and significantly reduces the time needed to install or remove cables.

It is another object of the present invention to provide adjustable strain relief for multiple data cables that also provides EMI shielding.

Still another object of the present invention is providing a strain relief device with EMI shielding that can also be retrofitted in many cases to existing cabinets.

Yet another object of the present invention is providing a strain relief device with EMI shielding that requires no new tools for field installation or maintenance.

SUMMARY OF THE INVENTION

These and other objects are achieved by a strain relief bulkhead that provides EMI shielding for data cables being inserted into cabinets, comprising a conductive vise, slidably mounted on a stationary guide track that is permanently attached to a bracket made of conductive material to which a conductive cover panel is removably fastened. In a preferred embodiment the vise is moved along the guide track by a threaded screw which extends through threaded openings in the guide track. A C-ring holds the end of the screw to the vise. The bracket containing the vise and guide track is fastened to the cabinet which houses the printed circuit boards by screws or other means. The vise is located on the guide track and the guide track is attached to the bracket in such a way as to provide cable openings through which cables can be inserted. As cables are inserted they are held in place, after fastening the cover panel to the bracket, by sliding the vise to hold the cables against the walls of the bracket, the vise, and the cover panel, thus grounding the cables for EMI shielding and providing strain relief.

It is an aspect of the present invention that it provides adjustable strain relief along with EMI shielding for multiple data cables.

It is another aspect of the present invention that it reduces installation time for data cables from forty-five minutes or more to about 5 minutes per cabinet, providing a substantial cost savings in personnel time and expense.

Still another aspect of the present invention is that it can be retrofitted into cabinets already having a bulkhead design.

Yet another aspect of the present invention is that in a preferred embodiment it can be installed and operated using existing tools, thus eliminating the need for new tools for service personnel.

BRIEF DESCRIPTION OF THE DRAWINGS

FIG. 5 is a perspective side view of the vise, guide track and bracket of the present invention.

FIG. 7a is a two-dimensional side view of the bracket and vise of the present invention.

FIG. 7b is a two-dimensional top view of the bracket and vise of the present invention.

FIG. 7c is a two-dimensional front view of the vise of the present invention.

FIG. 8a is a front view of the bracket and guide track of the present invention.

FIG. 8b is a front view of a rear wall of the guide track of the present invention.

FIG. 8c is a two-dimensional top view of the bracket and guide track of the present invention.

FIG. 8d is a front view of the guide track of the present invention.

FIG. 8e is a top view of the guide track of the present invention.

FIG. 8f is a front of the rear wall of the guide track of the present invention.

FIG. 8g is a front view of the vise of the present invention.

FIG. 8h is a side view of the vise of the present invention.

FIG. 8i is a bottom view of the vise of the present invention.

DETAILED DESCRIPTION OF THE INVENTION

Figure 1:
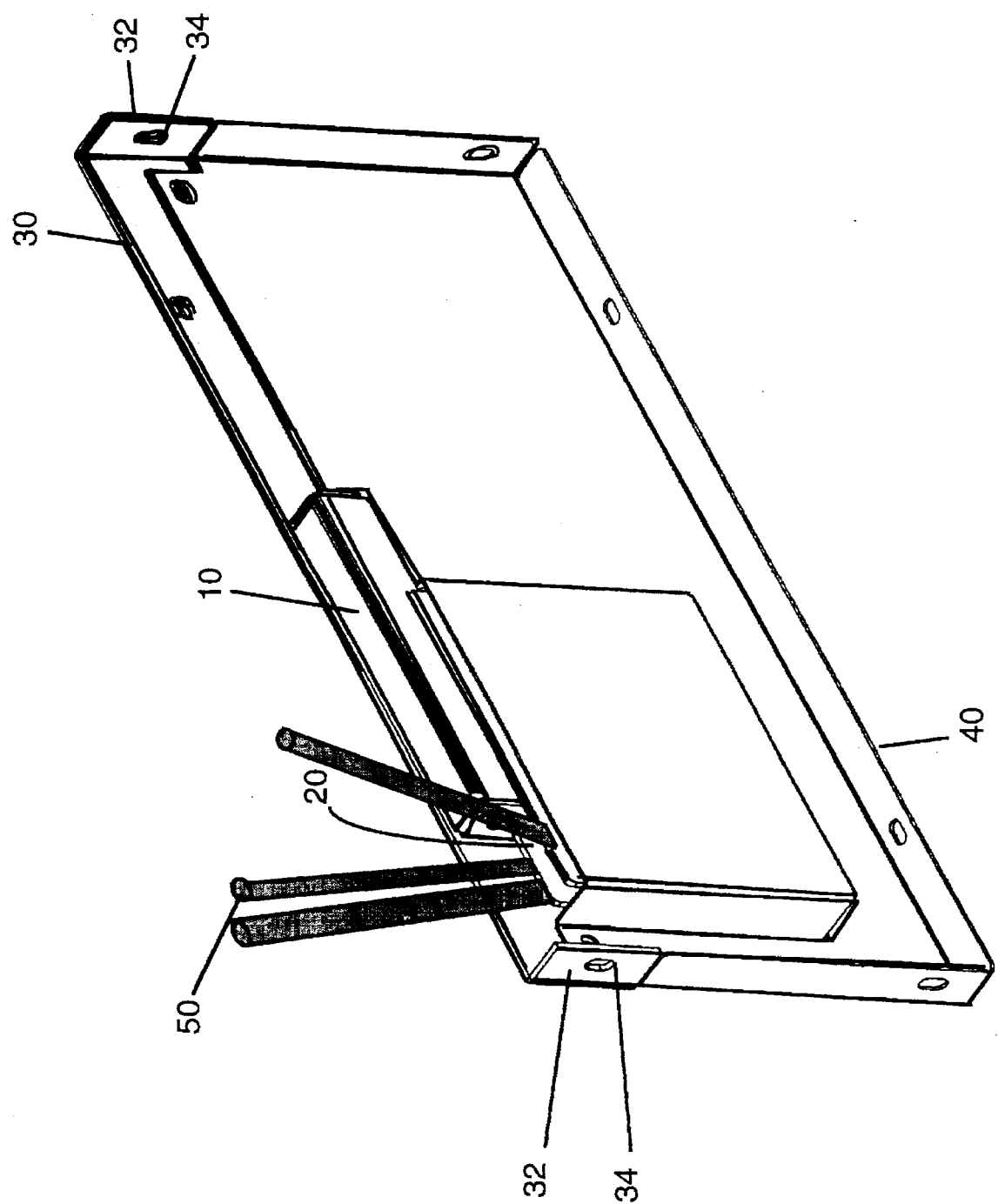
FIG. 1 is a perspective drawing taken from the outside of the present invention.

With reference now to FIG. 1, vise 10 is shown slidably mounted on guide track 20 which forms part of bracket 30. Bracket 30 has two upwardly extending flanges 32, each having a screw insertion aperture 34. In a preferred embodiment, bracket 30 is attached to the rear of a cabinet housing by means of screws inserted through screw insertion apertures 34. Vise 10 is slidably mounted on guide track 20 of bracket 30. Multiple SCSI-type data cables 50 are inserted through the openings in guide track 20. Cables 50 having a grounding mesh braid jacket, are inserted through openings in guide track 20, so that as vise 10 is moved along guide track 20 vise 10 compresses cables 50 against each other, the sides of bracket 30, cover panel 40 and the front of vise 10, thus grounding cables 50. When the desired number of cables 50 have been inserted or removed by service personnel, and cover panel 40 has been mounted to the cabinet and bracket, vise 10 is moved to compress or "crush" data cables 50 into place. Cover panel 40 is removably mounted over the downwardly extending portions of cables 50 and fastened to bracket 30 and through it, to the cabinet by means of screws or other removable fasteners. In a preferred embodiment, vise 10 is moved along guide track 20 by an adjustment screw to compress cables 50 against bracket 30, cover panel 40 and vise 10.

As can be seen in FIG. 1, vise 10 is used to compress cables 50 firmly against each other, the sides of conductive guide track 20, the inner wall of bracket 30, the inner parts of a bump-out area on cover panel 40 and the front of vise 10 itself to form an adjustable strain relief. A cable 50 can be removed by moving vise 10 away from cables 50, after cover panel 40 has been removed so that one or more cables can be inserted or removed. When the insertion or removal is done, cover panel 40 is reinstalled and vise 10 is then slidably moved forward to compress cables 50 again, holding them in place and providing strain relief while the service technician completes the cabling work. Unlike one prior art solution to the strain relief problem, cables 50 can be installed or removed in approximately 5 minutes, instead of 45 or 60 minutes. In a preferred embodiment, this means that cables 50 need only be without strain relief or EMI shielding for a short, 5 minute period of time during maintenance on them. This significantly reduces the opportunity to cause damage to the valuable printed circuit boards connected to data cables 50. This significant time reduction is a result of the ease of use of the present invention.

Figure 2:
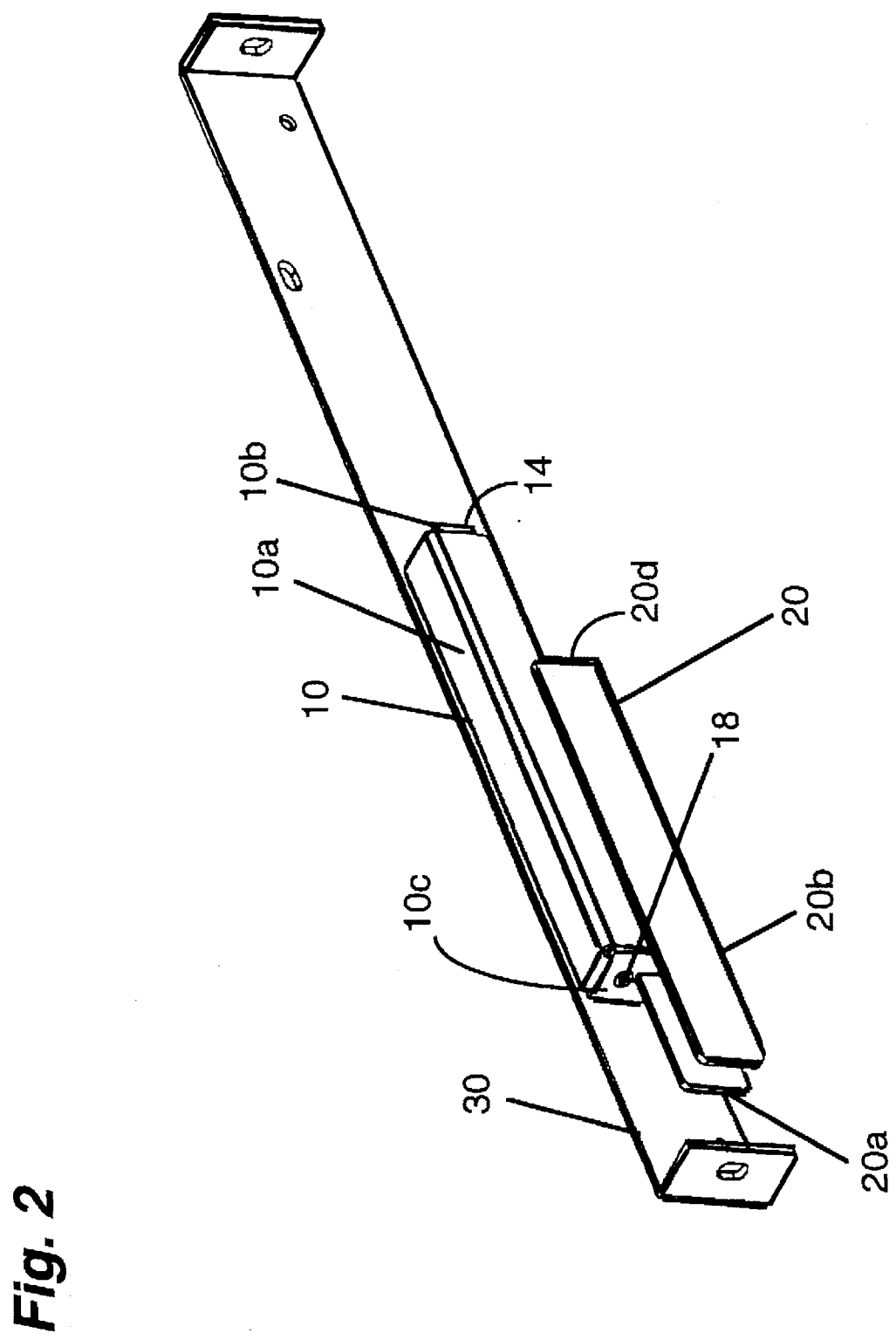
FIG. 2 is a perspective side view of the vise, guide track and bracket of the present invention.

Turning now to FIG. 2, vise 10 and guide track 20 can be seen more clearly from this side perspective view. As can be seen, guide track 20 is formed of two long flanges 20a and 20b that are spaced apart from each other and from the side of bracket 30. This spacing is designed to be slightly smaller than the diameter of the type of data cable 50 that the unit is designed to hold. For example, for SCSI cables 50, having a diameter of 0.400 inches, the space between bracket 30 and guide track flange 20a would be 0.390 inches, as would the space between guide track flange 20a and guide track flange 20b. This predetermined spacing creates cable openings in guide track 20. As will be apparent to those skilled in the art, the dimensions of this spacing and construction will vary for data cables of varying sizes. In a preferred embodiment, the invention is directed to SCSI cables and similar data cables jacketed in a crushable mesh, but as will be apparent to those skilled in the art the invention could be modified to work with data cables that are grounded by means of crimps or ferrules designed to come into contact with a ground, so long as grounding and strain relief can be accomplished through compression or crushing by a device substantially similar to vise 10.

In a preferred embodiment, vise 10, like bracket 30, guide track 20 and cover panel 40 is made of electrically conductive cold rolled steel, and is zinc plated to prevent corrosion. As will be apparent to those skilled in the art, all or some of these parts of the present invention could be made of any other sufficiently rigid substance having corrosion resistance or that is coated for corrosion resistance that would provide strain relief and would also serve as an adequate ground to provide EMI shielding.

Still in FIG. 2, vise 10 is formed with a top surface 10a and two downwardly extending tabs 10b and 10c at either end. In a preferred embodiment, a screw 14 is inserted through a screw insertion aperture in tab 10b of vise 10. In a preferred embodiment screw 14 is a ¼ inch in diameter, 20 threads per linear inch screw having a hex bolt at its head. As will be apparent to those skilled in the art, screws of other dimensions and threading can be used to impart the desired qualities to vise 10. In a preferred embodiment, screw 14 is inserted through an aperture in tab 10b of vise 10 using a washer between the head of the screw and tab 10b. Standard tools such as a screwdriver for hex bolts can be used to move the screw forward and back along guide track 20. In a preferred embodiment, the same screwdriver is used for other existing parts and thus this embodiment eliminates the need for any special or new tools for service personnel.

Figure 3:
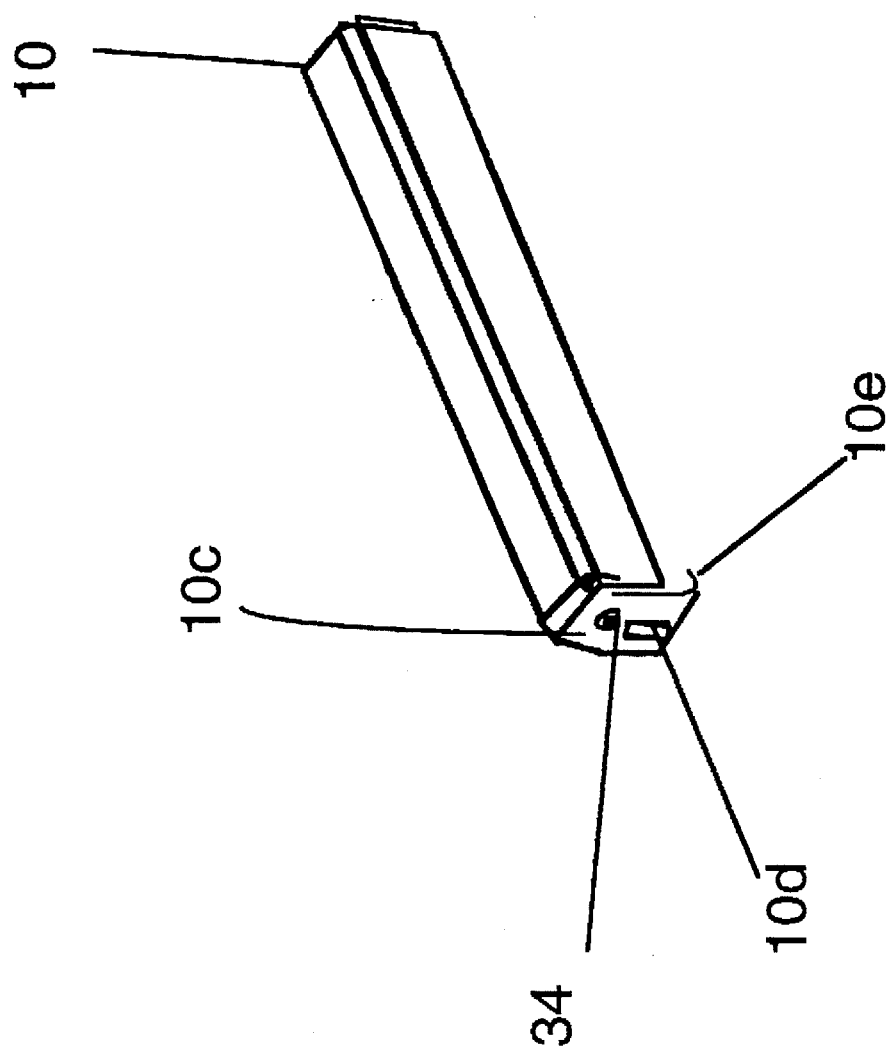
FIG. 3 is a perspective three quarters side view of the vise of the present invention.

Turning now to FIG. 3, tab 10c of vise 10 is formed with two openings in it, a round screw insertion aperture 34, and a longitudinal slot 10d through which flange 20a of guide track 20 will fit. Tab 10c is crimped back under at its lower-most extremity to form return flange 10e so that the longitudinal slot 10d in tab 10c allows vise 10 to be inserted over flange 20a, so that vise 10 can slide forward and backward along flange 20a's length. Return flange 10e keeps vise 10 from being lifted off of flange 20a when vise 10 is fully extended for compression.

Turning now to FIG. 5, a slightly different perspective view of bracket 30, vise 10 and guide track 20 is shown. In this view, hex bolt 14a and washer 14b of screw 14 can be seen. In a preferred embodiment, the use of this hex bolt 14a as the head of screw 14 allows a service technician to use an existing tool for adjusting screw 14 to compress or loosen it.

Returning to FIG. 2, it can be seen that C-ring 18 is used in a preferred embodiment to hold screw 14 in place against the outer portion of tab 10c of vise 10. Thus, as screw 14 is moved in one direction, vise 10 advances to the left along guide track 20 until it is stopped by the interior of tab 10b of vise 10 abutting the exterior of rear wall 20d of guide track 20 (rear wall 20d is shown in FIG. 5). When screw 14 is turned in the opposite direction, vise 10 moves rightward along guide track 20 until it is stopped by the interior of tab 10c abutting the interior of rear wall 20d (shown in FIG. 5) of guide track 20. The range of movement of vise 20 is constrained between those two points in a preferred embodiment. As will be apparent to those skilled in the art, the direction of movement and the placement of cable openings could also be arranged differently. For example, vise 10 could be placed closer to the rightmost side of bracket 30, face right, together with guide track 20 and move to the right to compress cables.

Still in FIG. 2, the distance which vise 10 is allowed to travel and the spacing between the leftmost wall of bump-out 42 of cover panel 40 (seen in FIG. 6a) and the exterior of tab 10c of vise 10 is set to permit some maximum number of cables 50 to be inserted. In a preferred embodiment, cables can be inserted between flange 20a and the wall of bracket 30 or between flange 20a and flange 20b, allowing two "layers" of cables to be inserted. Preferred embodiments are designed to hold some maximum multiple of cables 50. For example, 8 cables 50 could be accommodated by an embodiment designed for that number, while other embodiments could be constructed to hold maximums of 4 or 16 or 32 or more data cables as desired. Depending on the diameters of the cables 50 and the dimensions of the present invention, it may be necessary to use a dummy cable when only one cable is being inserted, to insure that the actual cable 50, when compressed by vise 10, is in contact with ground on all sides. The pressure exerted by vise 10 and by each of the cables 50 on each other and against the walls of bracket 30 and cover panel 40 provides both the EMI shield (by insuring that cables 50 are in contact with ground in all directions) and good strain relief.

Figure 4:
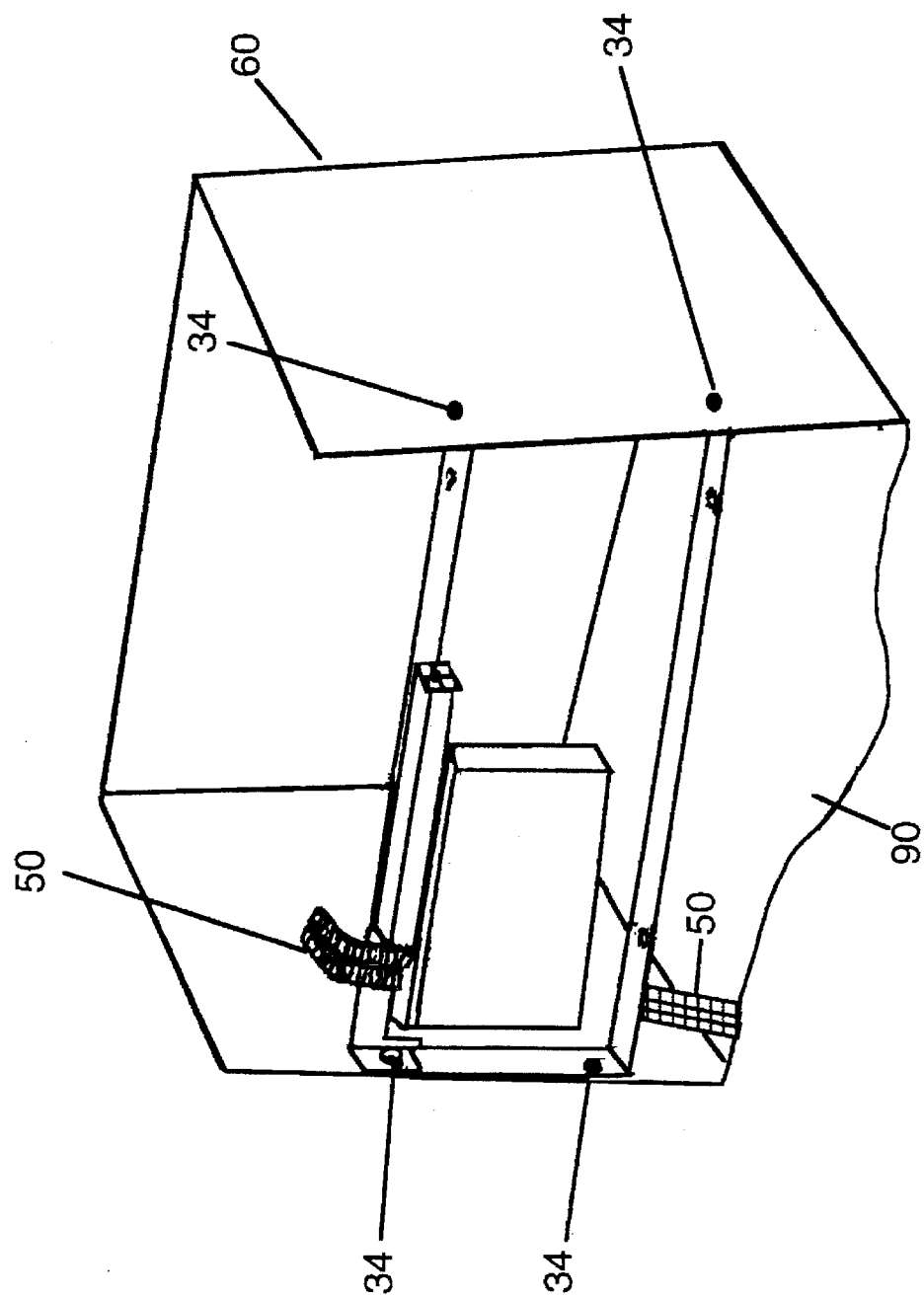
FIG. 4 is a perspective, cutaway drawing of the present invention mounted in the back of a cabinet housing a number of printed circuit boards.

With reference now to FIG. 4, a perspective view of the present invention mounted in a cabinet 60 is shown. As can be seen, the bulkhead formed by the present invention is fastened to the walls of cabinet 60 by means of screws through the screw insertion apertures 34 of bracket 30 and cover panel 40. Cables 50 come up from bus and tag area 90, (which is a cable access area in the bottom of the cabinet or housing of a preferred embodiment) through the openings formed by guide track 20 and are connected via connectors to printed circuit boards in the cabinet 60. In a preferred embodiment, other panels cover the areas occupied by the printed circuit boards above bracket 30 and bus and tag area 90 below cover panel 40. In a preferred embodiment, the present invention is designed to be retrofitted into existing cabinets 60 by replacing EMI blocks currently in use.

Figure 6A:
FIG. 6a is a two-dimensional top view of the cover panel of the present invention.
Figure 6B:
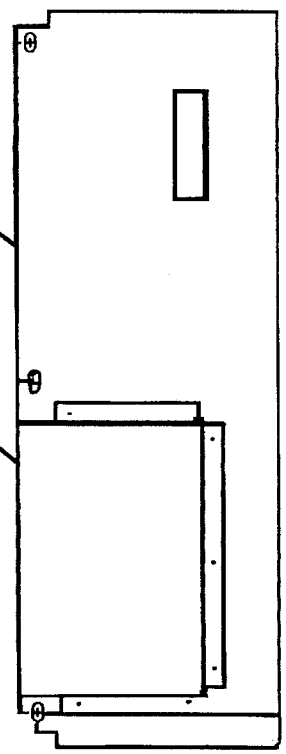
FIG. 6b is a two-dimensional front view of the cover panel of the present invention.
Figure 6C:
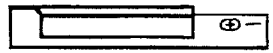
FIG. 6c is a two-dimensional side view of the cover panel of the present invention.
Figure 6D:
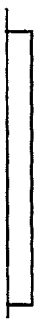
FIG. 6d is a two-dimensional top view of the cover panel of the present invention.
Figure 6E:
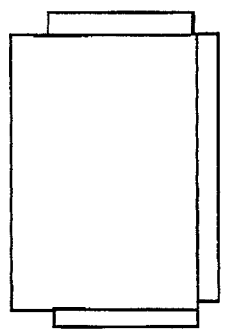
FIG. 6e is a two-dimensional front view of a bump-out in the cover panel of the present invention.

Now referring to FIG. 6a, a two dimensional top view of cover panel 40 is shown. As seen in the front view provided by FIG. 6b, cover panel 40 has a rectangular bump-out 42 having a width that is shaped to fit over guide track 20 when cover panel 40 is fastened to bracket 30 and to the cabinet. Vise 10 compresses cables 50 against the leftmost side wall of bump-out 42. As can be seen in FIG. 1, the length of bump-out 42 is longer than is needed to cover guide track 20. In a preferred embodiment, this additional depth is to allow for cable bend radii. It is desirable to have the most generous radius bend for cables that can be afforded. This contributes to ease of use and lessens the likelihood that undue force will be applied to the cables. FIG. 6d shows a side view of bump-out 42 and FIGS. 6d and 6e show a top and front view of it, respectively. As will be apparent to those skilled in the art, the dimensions of bump-out 42 may vary if different types of cables 50, having different radius bends are desired.

In FIG. 7a two-dimensional side view of bracket 30 and vise 10 are shown. Vise 10 has a downwardly extending front tab 10c, which has a return flange 10e at its lowermost edge. As can be seen in this partial cutaway view, screw 14 passes through vise 10. In FIG. 7b, a top view of bracket 30 and a partial cutaway view of vise 10 is shown, depicting screw 14 as it has been inserted inside vise 10.

FIG. 7c shows a front view of front tab 10c of vise 10. In this view, the end of screw 14 shows through screw insertion aperture 34 and is held in place there by C-ring 18. Also visible in this view is longitudinal slot 10d, which is formed in tab 10c to permit vise 10 to slide on guide track 20.

Returning to FIG. 7b it also shows a view of screw 14, having a hex bolt 14a welded to its head to prevent rotation of hex bolt 14a around screw 14. In a preferred embodiment, screw 14 is a ¼ inch, 20 threads per linear inch screw having a length of approximately 7.2 inches. As will be apparent to those skilled in the art, other types of screw may be used in vise 10 to enable it to slide forwards and backwards over guide track 20. It will also be apparent that vise 10 could be implemented without a screw for imparting movement but could use latches instead, or other types of motion impelling and compressing means. Pressure latches, or spring latches, for example could be used instead of a screw to advance and compress the cable in a manner that can be released and adjusted. A pin and hole mechanism could be used, or a mechanism similar to a ratchetable rack could be used, as well. In a preferred embodiment, a screw of the dimensions described herein was selected to allow slower, smaller increments of movement, but one having fewer threads per linear inch would allow faster, larger increments of movement if that were desired.

Turning now to FIG. 8a, a front view of bracket 30 and guide track 20 is shown. Guide track 20 has a rear wall 20d, which includes within it a threaded fastener 20e, formed as part of rear wall 20d and threaded to guide screw 14 when it is inserted through vise 10 and rear wall 20d. FIG. 8b shows a front view of rear wall 20d, with threaded fastener 20e, which is one-quarter inch by 20, to allow screw 14 to impart movement. As will be apparent to those skilled in the art, other ways of creating a thread to guide screw 14 can be used, such as extruding a thread in the sheet metal comprising guide track 20. FIG. 8c is a two-dimensional top view of bracket 30, having two flanges 32 at each of its ends. In a preferred embodiment, guide track 20 is welded to bracket 30 by attaching the side of rear wall 20d to the inside of bracket 30. In this view, it can be seen that guide 20 has two long flanges 20a and 20b which serve as guide rails, as it were for vise 10. Longitudinal slot 10d in vise 10 fits around flange 20a of guide track 20. And in a preferred embodiment, a side flap 10g of vise 10 fits inside flange 20b, so that vise 10 is both partially contained and guided by guide track 20.

FIG. 8d is a front view of guide track 20, and FIG. 8e shows a top view of guide track 20.

FIG. 8f is a front view of rear wall 20d of guide track 20, showing threaded fastener 20d. FIG. 8g is a front view of tab 10c of vise 10, showing longitudinal slot 10d through which flange 20a of guide track 20 passes. FIG. 8h is a side view of vise 10, showing return flange 10e in tab 10c of vise 10. FIG. 8i is a bottom view of vise 10, showing return flange 10e.

Those skilled in the art will appreciate that the embodiments described above are illustrative only, and that other systems in the spirit of the teachings herein fall within the scope of the invention.

What is claimed is:

1. An apparatus for providing EMI shielding and adjustable strain relief for a plurality of data cables connected to printed circuit boards mounted in a housing, comprising:

a conductive bracket capable of being attached to said housing, said conductive bracket being formed of a substantially rigid material and having an inner wall;

a conductive guide track, permanently attached to said inner wall of said conductive bracket and being formed from a substantially rigid material extending away from said inner wall perpendicularly for a first specified distance, and then curved at substantially a 90 degree angle to form at least one flange extending horizontally in parallel to said inner wall, thus forming a cable opening between said inner wall and said flange of a predetermined size that is less than the diameters of said data cables;

a conductive vise slidably mounted on said flange of said conductive guide track and having a motion impelling device permitting said vise to move forward and backward on said flange; and a conductive cover panel capable of being removably attached to said conductive bracket and said housing so that said data cables may be inserted through said cable opening, so that after said conductive cover panel is attached to said bracket and said housing, said conductive vise may be moved against said data cables, compressing said data cables into contact with each other, with said conductive bracket, with said conductive cover panel and with said conductive vise, thus providing both a strain relief and an EMI shield for said data cables.

2. The apparatus of claim 1, wherein said conductive guide track is formed having two flanges, art inner flange and an outer flange, so that two cable openings are created.

3. The apparatus of claim 1, wherein said conductive vise further comprises a screw mechanism for impelling motion.

4. The apparatus of claim 1, wherein said conductive vise further comprises a latch mechanism for impelling motion.

5. The apparatus of claim 3, wherein said screw mechanism is guided by a threaded fastener in said conductive guide track and is held in place by a C-ring at its end.

6. The apparatus of claim 5, wherein said conductive vise further comprises a front tab having a longitudinal slot through which said flange of said guide track can fit, so that said vise can be slidably moved forward and backward along said flange.

7. The apparatus of claim 6, wherein said front tab extends downward from the top surface of said conductive vise and extends below said longitudinal slot, so that the lower portion of said tab is crimped to create a return flange that holds said conductive vise in place vertically.

8. The apparatus of claim 5, wherein said screw mechanism further comprises a screw having a head shape that is compatible with existing tools, so that said data cables can be inserted and removed from said housing without requiring new tools.

9. The apparatus of claim 1, wherein said conductive cover panel includes a bump-out area formed within it which is substantially large enough to cover said conductive guide track and to provide a space that accommodates bend radii of said data cables.

10. The apparatus of claim 1, wherein said housing are existing cabinets, and wherein said conductive bracket, said conductive guide track, said conductive vise and said conductive cover panel are capable of being retrofitted into said existing cabinets.

11. The apparatus of claim 1, wherein said conductive bracket, said conductive guide track, said conductive vise and said conductive cover panel are made from cold-rolled steel and plated with a corrosion resisting substance.

* * * * *